(12) United States Patent
Lee et al.

(10) Patent No.: US 6,748,672 B2
(45) Date of Patent: Jun. 15, 2004

(54) WAFER DRYERS FOR SEMICONDUCTOR CLEANING APPARATUSES

(75) Inventors: Sung-Hee Lee, ChoonCheongNam-do (KR); Sang-Wha Lee, ChoonCheongNam-do (KR)

(73) Assignee: DNS Korea Co., Ltd., Chonan-shi (KR)

(*) Notice: Subject to any disclaimer, the term of this patent is extended or adjusted under 35 U.S.C. 154(b) by 0 days.

(21) Appl. No.: 10/307,105

(22) Filed: Nov. 27, 2002

(65) Prior Publication Data

US 2003/0101618 A1 Jun. 5, 2003

(30) Foreign Application Priority Data

Dec. 1, 2001 (KR) ............................... 10-2001-0075657

(51) Int. Cl.[7] ................................................. F26B 13/00
(52) U.S. Cl. .............................. 34/630; 34/323; 34/487; 34/614; 134/902
(58) Field of Search .......................... 34/448, 444, 467, 34/487, 72, 614, 232, 218, 630; 134/902

(56) References Cited

U.S. PATENT DOCUMENTS

| 5,845,660 A | * | 12/1998 | Shindo et al. ............. 134/56 R |
| 5,885,360 A | * | 3/1999 | Han et al. ....................... 134/1 |
| 6,352,083 B1 | * | 3/2002 | Araki et al. .............. 134/56 R |
| 6,430,840 B1 | * | 8/2002 | Jung ............................ 34/468 |
| 6,510,859 B1 | * | 1/2003 | Kamikawa ................... 134/61 |

* cited by examiner

*Primary Examiner*—Ira S. Lazarus
*Assistant Examiner*—Kathryn S. O'Malley
(74) *Attorney, Agent, or Firm*—Marger Johnson & McCollom, P.C.

(57) ABSTRACT

A wafer dryer for use in a semiconductor cleaning apparatus includes an internal bath, an external bath, a solution supply line, a solution drain line, a pump, and drying means. The solution drain line has a first drain line and a second drain line. A pump for constantly maintaining a speed of a drained solution is installed on the first drain line. The drying means has an isopropyl alcohol (IPA) nozzle, a first gas spray nozzle for spraying $N_2$ gas, and a second spray nozzle. The second spray nozzle is installed on all inner sidewalls of the external bath and has a plurality of holes. Thus, no wave is produced at a surface of the drained solution.

19 Claims, 5 Drawing Sheets

WAFER DRYERS FOR SEMICONDUCTOR CLEANING APPARATUSES

FIELD OF THE INVENTION

The present invention relates to a cleaning apparatus for semiconductor fabrication and, more particularly, to a wafer dryer for a cleaned wafer.

BACKGROUND OF THE INVENTION

With the trend toward a high integration density of semiconductor devices, particles remaining at a wafer surface have a great effect on device characteristics. Thus, wafer cleaning technologies for removing particles are recently getting significant in a semiconductor fabricating process.

In order to uniformly clean a wafer surface without damage, a wet cleaning technique is mainly used. As a wafer caliber increases while a chip size decreases, a bath system employing a wet station is widely used.

A wafer cleaning apparatus has baths containing different solutions so as to clean wafers through several cleaning steps. By passing the baths, the wafers are completely cleaned. The last cleaning step is to dry the completely cleaned wafers. They are dried by a wafer dryer.

A conventional wafer dryer is illustrated in FIG. 1.

Referring to FIG. 1, a wafer dryer 100 includes an internal bath 10, an external bath 20, a wafer guide 30, and a direction-adjusting valve 40, drying means, a solution supply line 50, and a solution drain line. The wafer dryer 100 serves to finally clean and dry wafers.

The drying means has an isopropyl alcohol (hereinafter referred to as "IPA") nozzle 90 and a gas spray nozzle 80 for spraying $N_2$ gas. The solution drain line has a first drain line 60 and a second drain line 70 for faster draining solutions than the first drain line 60.

A wafer cleaning solution is supplied to the internal bath 20 from the solution supply line 70 having a valve 522 for adjusting the amount of the supplied solution. The solution overflowing from the internal bath 10 is received into the external bath 20. The solution overflowing from the external bath 20 is sent to the outside through an opened bottom of the external bath 20. The wafer guide 30 is installed in the internal bath 10 to receive a plurality of wafers. Thus, they may be cleaned and dried at the same time. If the wafers are mounted upon the wafer guide 30 of the internal bath 10 containing the solution, particles remaining at the wafers float on the solution in the internal bath 10. The floating particles are mixed with the solution overflowing to the external bath 20 to be sent to the outside.

After the particles are removed by the solution overflowing to the external bath 20, IPA is sprayed into the internal bath 10 from the IPA nozzle 90. The solution in the bath 10, where an IPA liquid film is formed, is slowly drained through the first drain line 60. A valve 62 for adjusting the amount of the drained solution is installed on the first drain line 60. While the solution in the internal bath 10 is slowly drained, the particles attached to the wafer surface are removed by the surface tension of de-ionized (DI) water and the IPA. The DI water is exchanged into the IPA liquid film to be evaporated. A surface tension difference between the DI water and the IPA prevents re-attachment of the particles and serves to remove water from the wafer surface, which is called the "Marangoni Effect".

If the solution in the internal bath 10 goes down to the lowest part of the wafer through the first drain line 60, remaining solution is rapidly drained through the second drain line 80. A valve 72 for adjusting the amount of the drained solution is installed on the second drain line 90. A diameter of the second drain line 90 is greater than that of the first drain line 80. Thus, a drain speed of the second drain line 70 is much higher than that of the first drain line 60. After the solution in the internal bath 20 is completely drained, heated $N_2$ gas is sprayed from the gas spray nozzles 80 installed at an upper part of the internal bath 20 to dry the wafers. The gas spray nozzles 80 spray heated $N_2$ gas for drying wafers so as to suppress formation of an oxide layer on wafer surfaces. Moreover, the gas spray nozzles 80 continue to spray $N_2$ gas of normal temperature into the internal bath 10 during the entire process so that oxygen of a peripheral environment can be removed to suppress formation of an oxide layer on wafer surfaces.

Unfortunately, the above-described wafer dryer has a few problems as follows.

Firstly, both the first and second drain lines 60 and 70 drain a solution by means of the gravity. Thus, a solution-draining speed is varied according to the amount of the solution contained in the internal bath 10. That is, the solution-draining speed becomes lower as the solution contained in the internal bath 10 is drained. As a result, time required for cleaning and drying wafers becomes longer and the reliability of the wafers is deteriorated.

Secondly, as the gas spray nozzles 80 directly spray $N_2$ gas of normal temperature downwardly toward a surface of the solution contained in the internal bath 10, a wave is created at the solution surface when the solution is drained through the first drain line 60, as shown in FIG. 2. Thus, an IPA liquid film formed at a DI water surface is broken, and it is difficult that removing particles and drying wafers are achieved by way of the Marangoni Effect.

SUMMARY OF THE INVENTION

A feature of the present invention is to provide a wafer dryer which can maximally exert the Marangoni Effect by constantly keeping a solution drain speed.

Another feature of the present invention is to provide a wafer dryer which can stably maintain a surface of a drained solution without a wave.

According to the present invention, a wafer dryer for use in a semiconductor cleaning apparatus includes an internal bath for containing a solution, an external bath for containing a solution overflowing from the internal bath, a solution supply line for supplying a solution to the internal bath, a solution drain line for draining a solution from the internal bath when the wafer is dried, a pump for constantly maintaining a speed of the drained solution, and drying means for drying the wafer. A wafer to be cleaned and dried is submerged in the internal bath, and the pump is installed on the solution drain line.

The waver dryer further includes a direction adjusting valve which is installed to communicate with the internal bath and determines one of the solution supply line and the solution drain line to open to the internal bath. The solution supply line and the solution drain line are connected to the direction adjusting valve.

The solution drain line has a first drain line and a second drain line for more fast draining the solution contained in the internal bath than the first drain line. The pump is installed on the first drain line. A valve for adjusting the amount of the drained solution is installed on the first and second drain lines, respectively.

The drying means has an isopropyl alcohol (IPA) nozzle which is installed on the internal bath and sprays IPA into the internal bath, a first spray nozzle which is installed on the internal bath to a gas into the internal bath, and a second spray nozzle which is installed on all inner sidewalls of the external bath and has a plurality of holes for injecting a gas to the external bath.

The wafer dryer further includes a speed converting apparatus for adjusting a rotation speed of the pump to convert a speed of the drained solution. The solution is a de-ionized (DI) water.

DESCRIPTION OF THE PREFERRED EMBODIMENT

Figure 1:
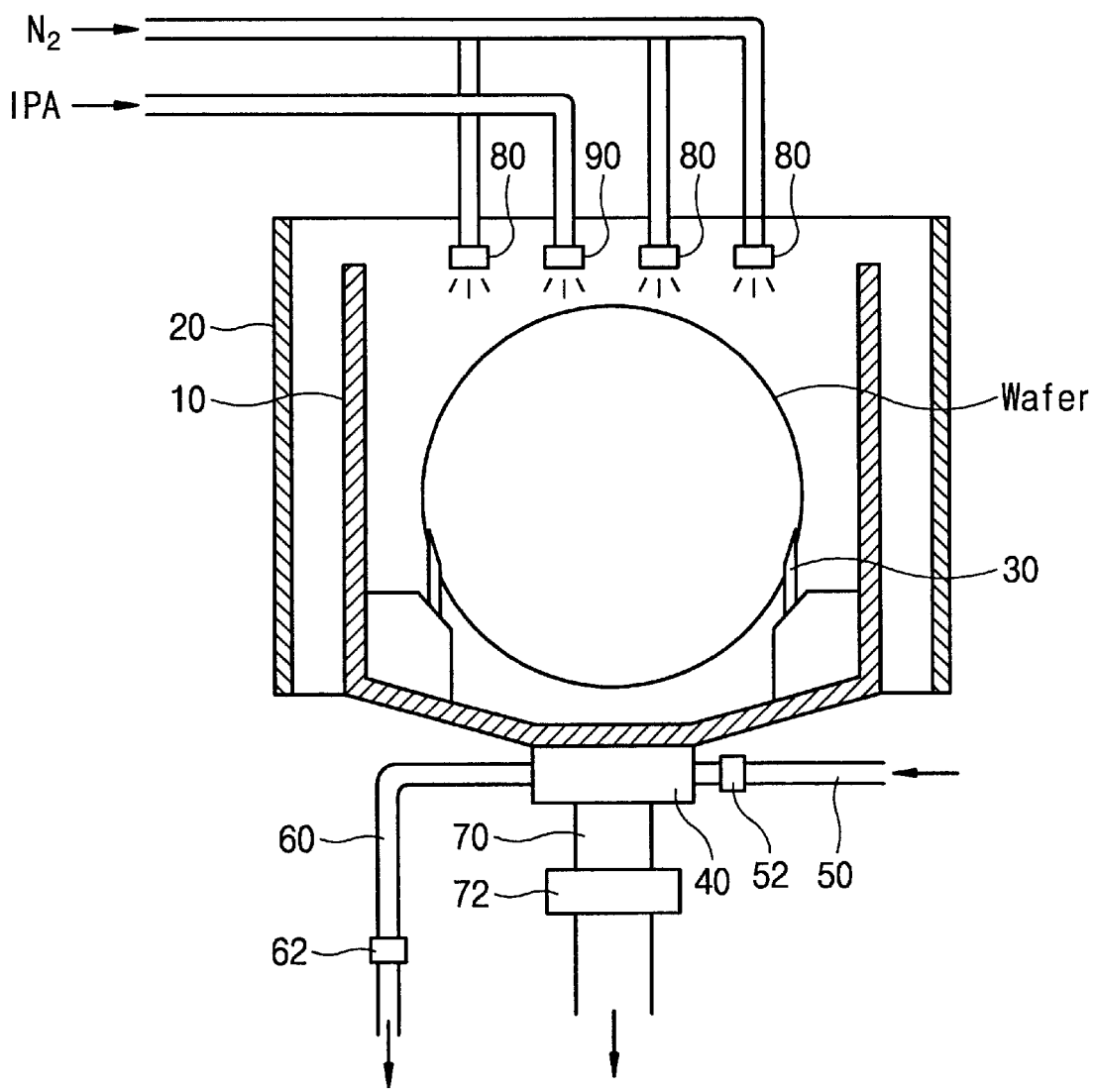
FIG. 1 is a schematic diagram of a conventional wafer dryer.
Figure 2:
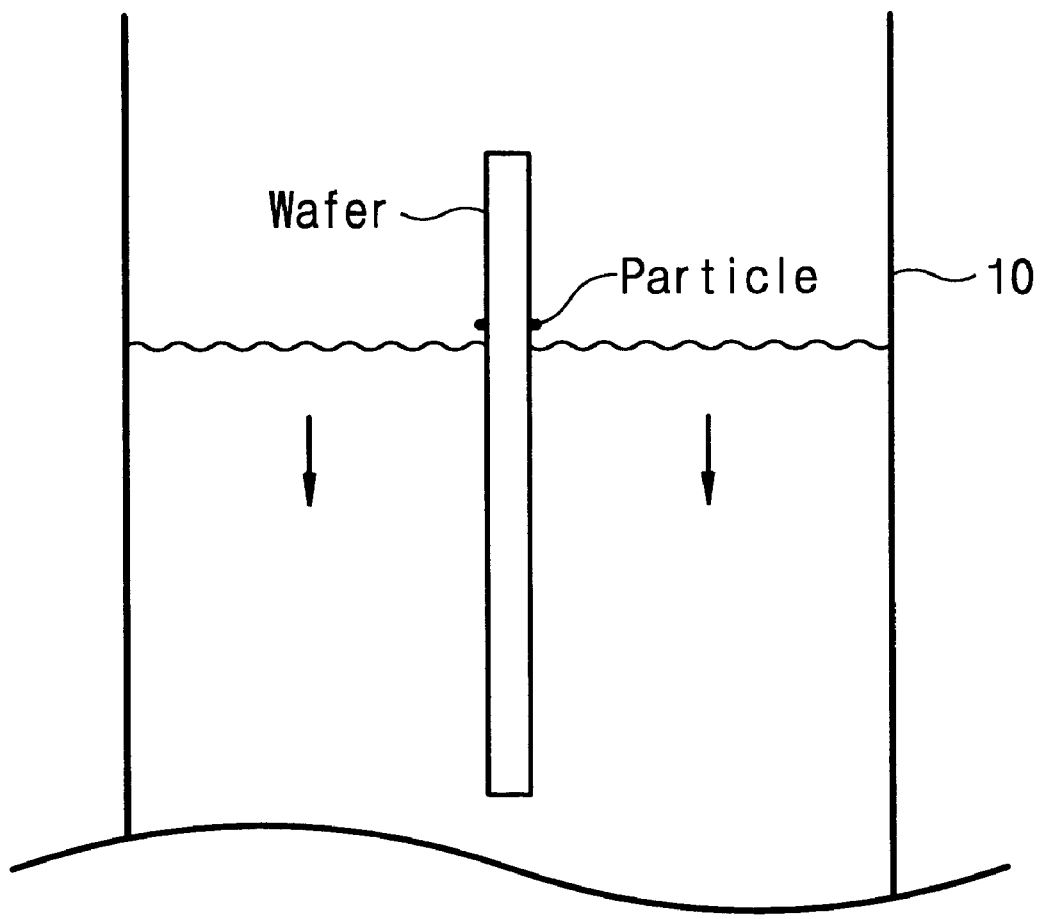
FIG. 2 is a diagram for explaining problems caused by a wave of a solution contained in an internal bath.
Figure 3:
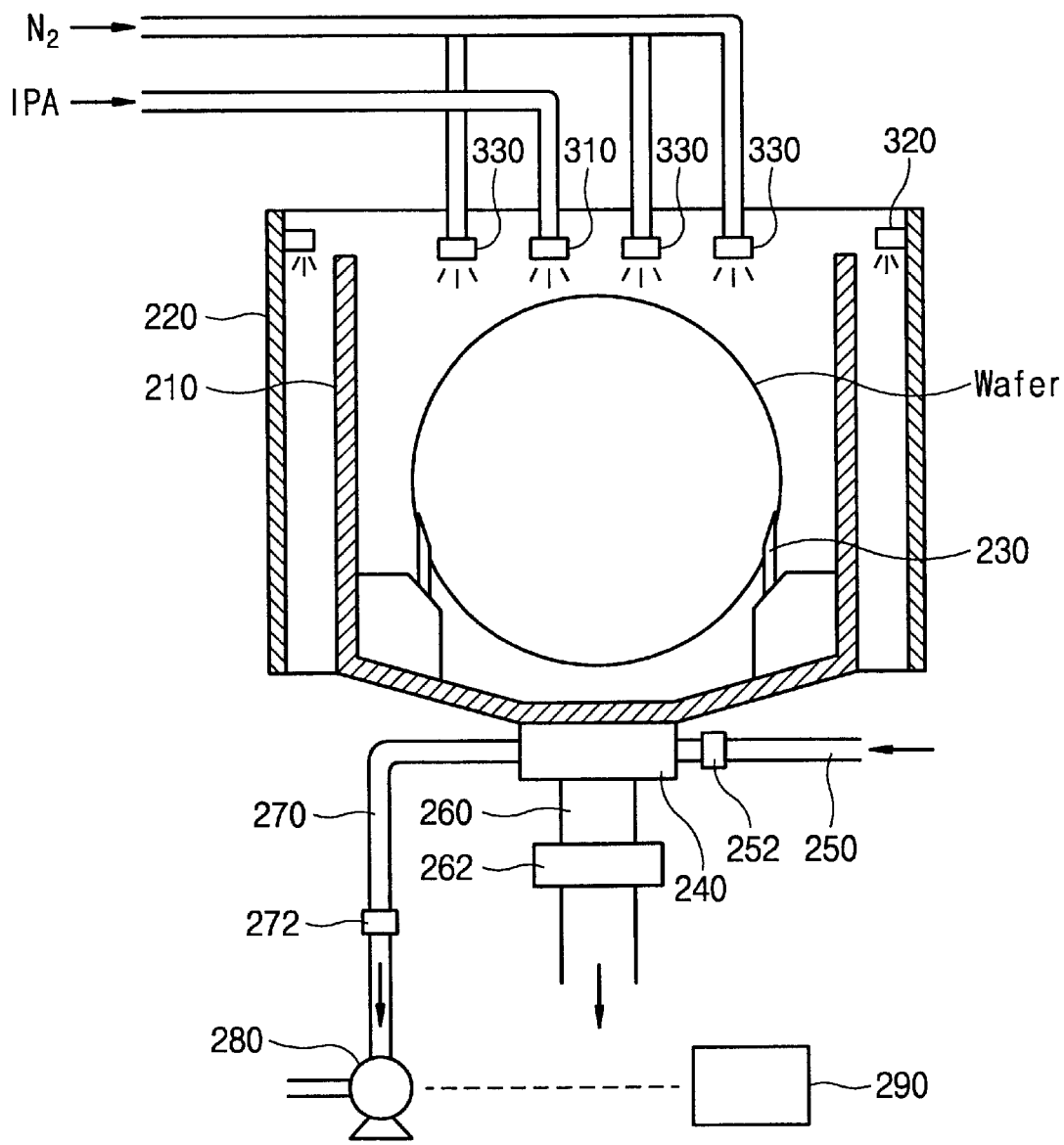
FIG. 3 is a schematic diagram of a wafer dryer according to a preferred embodiment of the present invention.
Figure 4:
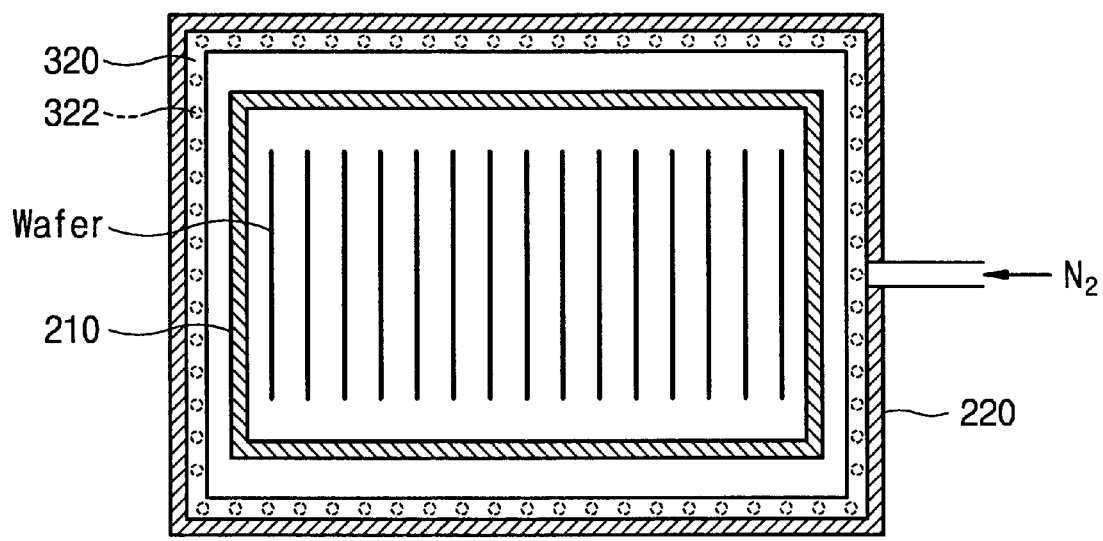
FIG. 4 is a top plan view of the wafer dryer shown in FIG. 3.

Referring to FIG. 3 and FIG. 4, a wafer dryer 200 for a semiconductor cleaning apparatus includes an internal bath 210, an external bath 220, a wafer guide 230, a direction adjusting valve 250, a solution supply line 260, a solution drain line, a pump 290, and drying means.

The solution supply line 260 supplies a solution for cleaning and drying wafers to the internal bath 210. The solution contained in the internal bath 210 overflows to be sent to external bath 220. The overflowing solution is drained to the outside through a drain line (not shown). The wafer guide 230 for receiving a plurality of wafers is installed in the internal bath 210.

When a plurality of wafers to be cleaned and dried are mounted upon the wafer guide 230, IPA is sprayed into a surface of the solution contained in the internal bath 210 from an IPA nozzle 310 that is one of the drying means. This method uses surface tensions of the DI water and the IPA. The solution having an IPA liquid film is slowly drained through the first drain line 270. A valve 272 for adjusting the amount of the drained solution is stalled on the first drain line 270. A pump 280 for constantly maintaining a solution drain speed is mounted upon the first drain line. Thus, the solution drain speed can be constantly maintained as compared to the prior art using the gravity. In addition, the solution drain speed can be converted by a speed converting device 290 for adjusting a rotation speed of the pump 280. As the solution contained in the internal bath 210 is slowly drained, it is possible to maximally exert the Marangoni Effect for removing particles produced at a wafer surface and drying water from a wafer.

When the solution contained in the internal bath 210 is drained to a lower part of the wafer through the first drain line 270, remaining solution is fast drained through the second drain line 260. In the drain line 260, the solution is drained by the gravity. A valve 260, which is opened and closed for draining a solution, is installed on the second drain line 260.

After the wafer is cleaned and dried by draining the solution contained in the internal bath 210, the wafer is finally dried by injecting a gas. A plurality of gas spray nozzles 330, which are one of the drying means, are installed on the internal bath 210 and spray heated $N_2$ gas into the internal bath 210 to dry wafers. Until the solution is drained through the first drain line 270, the first gas spray nozzles 330 do not spray the gas.

When the solution is drained through the first drain line 270, the $N_2$ gas of normal temperature is sprayed to the external bath 220 through the second gas spray nozzle 320. This is for eliminating oxygen in the wafer dryer 200 to prevent formation of an oxide layer at a wafer surface. As a result, no wave is created at a surface of the solution when the solution is drained through the first drain line 270.

The wafer dryer 200 has a direction adjusting valve 240 that is installed below the internal bath 210 and communicates therewith. The solution supply line 250 and the first and second drain lines 270 and 260 are connected to the direction adjusting valve 240. The direction adjusting valve 240 is a tri-direction adjusting valve where one direction is opened and the other directions are closed. That is, in a case where the solution is supplied to the internal bath 210 through the solution drain line 250, a connecting part of the direction adjusting valve 240 with the solution drain line 250 is opened to allow the solution to flow while connecting parts of the direction adjusting valve 240 with the first and second drain lines 270 and 260 are closed.

As illustrated in FIG. 4, the second gas spray nozzle 320 sprays $N_2$ gas of normal temperature to the external bath 220 so as to eliminate oxygen in the wafer dryer 200. The second gas spray nozzle 320 is installed on four internal sidewalls of the external bath 220, and has a plurality of holes for spraying gas to the external bath 220. When the solution is drained through the first drain line 270, the gas is sprayed into the external bath 220 through the second gas spray nozzle 320. Thus, no wave is produced at a surface of the drained solution. As a result, it is possible to prevent the breakage of an IPA liquid film formed at DI water surface, and to remove particles produced at a wafer surface and dry wafers more stably.

Figure 5:
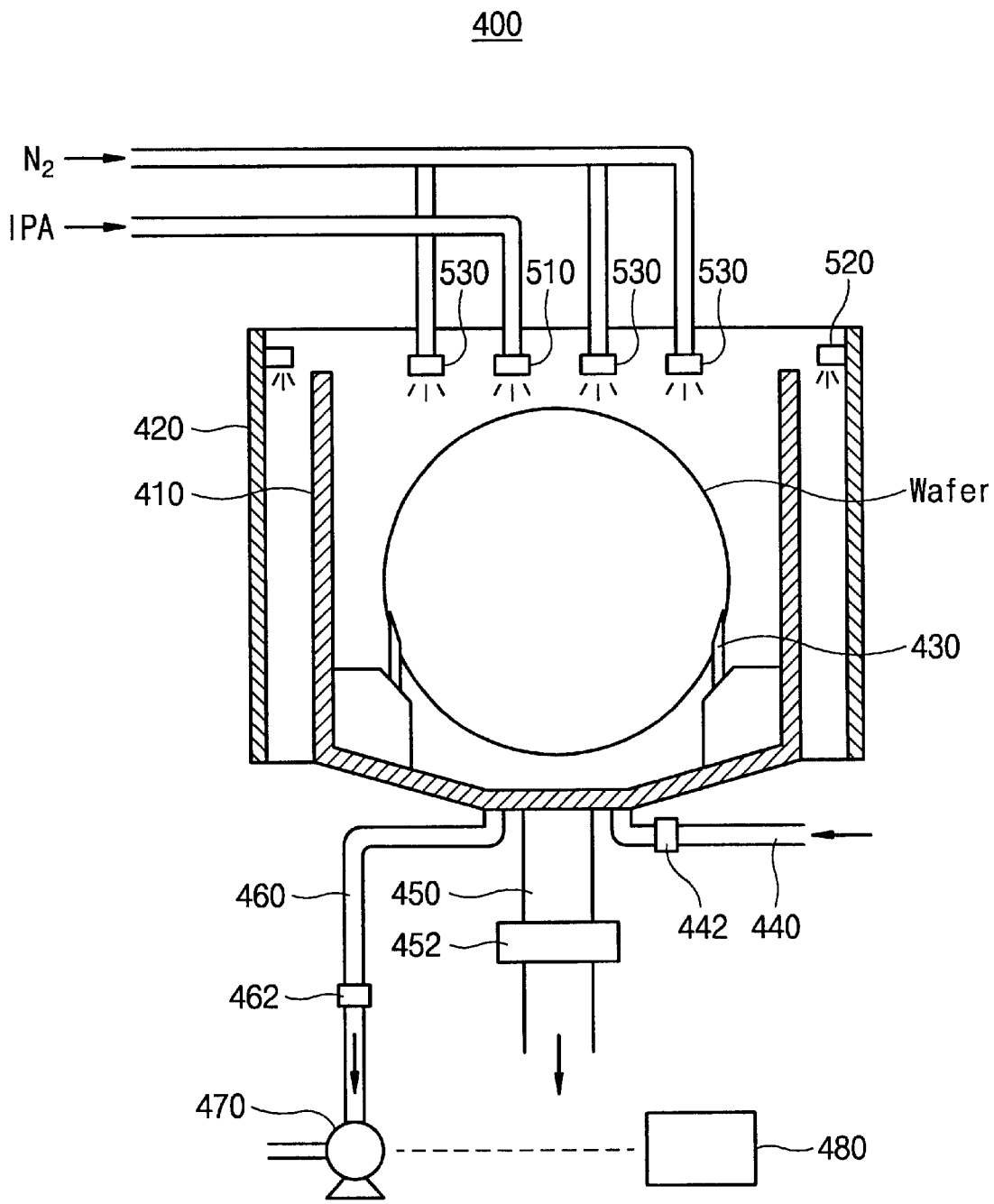
FIG. 5 is a diagram of a modified example of the wafer dryer according to the preferred embodiment of the present invention.

A wafer dryer 400 without the direction adjusting valve (shown in FIG. 3) is illustrated in FIG. 5. Referring to FIG. 5, a solution supply line 440, a first drain line 460, and a second drain line 450 are independently connected to an internal bath 410. A solution flow is adjusted by valves 442, 462, and 452 that are installed on the solution supply line 440, the first drain line 460, and the second drain line 450, respectively. The wafer dryer 400 has the same components as explained in FIG. 3, so that they will not be explained in further detail.

In summary, by installing a pump on a solution drain line, a speed of a drained solution is constantly maintained and adjusted to shorten a time required for drying wafers and to meet optimal drying process conditions for enhancing a quality to clean and dry the wafers. Further, since $N_2$ gas is not directly sprayed onto a solution surface when the solution is drained, no wave is produced at the solution surface. Therefore, it is possible to realize a stable environment for a cleaning process and a drying process.

While the present invention has been described in connection with specific and preferred embodiments thereof, it is capable of various changes and modifications without departing from the spirit and scope of the prevent invention.

What is claimed is:

1. A wafer dryer for use in a semiconductor cleaning apparatus, comprising:
    an internal bath for containing a solution, in which a wafer to be cleaned and dried is submerged;

an external bath for containing a solution overflowing from the internal bath;

a solution supply line for supplying a solution to the internal bath;

a solution drain line for draining a solution from the internal bath when the wafer is dried;

drying means for drying the wafer; and a direction adjusting valve for being connected to the internal bath and configured to determine which one of the solution supply line and the solution drain line is connected to the internal bath, wherein the solution supply line and the solution drain line are connected to the direction adjusting valve.

2. The wafer dryer as recited in claim 1, further comprising a wafer guide which is installed in the internal bath and receives a plurality of wafers.

3. The wafer dryer as recited in claim 1, wherein the solution drain line includes:

a first drain line; and a second drain line for draining the solution contained in the internal bath faster than the first drain line, wherein the pump is installed on the first drain line.

4. The wafer dryer as recited in claim 3, further comprising a first valve which is installed on the first drain line and adjusts the amount of the drained solution.

5. The wafer dryer as recited in claim 3, further comprising a second valve which is installed an the second drain line and adjusts the amount of the drained solution.

6. The wafer dryer as recited in claim 1, wherein the drying means includes:

an isopropyl alcohol (IPA) nozzle which is installed on the internal bath and sprays IPA into the internal bath;

a first spray nozzle which is installed on the internal bath, the first spray nozzle adapted to inject a gas into the internal bath; and a second spray nozzle which is installed on all inner sidewalls of the external bath; and has a plurality of holes for injecting a gas to the external bath.

7. The wafer dryer as recited in claim 6, wherein the gas is $N_2$.

8. The wafer dryer as recited in claim 1, further comprising a speed converting apparatus for adjusting a rotation speed of the pump to convert a speed of the drained solution.

9. The wafer dryer as recited in claim 1, wherein the solution is a de-ionized (DI) water.

10. A wafer dryer as recited in claim 1 further comprising a pump for constantly maintaining a speed of the drained solution, the pump being installed on the solution drain line.

11. A wafer dryer, comprising:

an internal bath for containing a solution, the internal bath adapted to contain a wafer;

an external bath for containing a solution overflowing from the internal bath;

a solution supply line for supplying a solution to the internal bath;

a solution drain line for draining a solution from the internal bath;

means for drying the wafer;

a direction adjusting valve for being connected to the internal bath and configured to select between the solution supply line and the solution drain line so that either one of the solution supply line and the solution drain line can be connected to the internal bath; and a pump for constantly maintaining a speed of the drained solution, the pump being installed on the solution drain line.

12. The wafer dryer as recited in claim 11, further comprising a wafer guide which is installed in the internal bath, the guide constructed to receive a plurality of wafers.

13. The wafer dryer as recited in claim 12, further comprising a first valve which the first drain line, the first valve adjusting the amount of the drained solution.

14. The wafer dryer as recited in claim 12, further comprising a second valve which is installed on the second in drain line, the second valve adjusting the amount of the drained solution.

15. The wafer dryer as recited in claim 14, wherein the gas is $N_2$.

16. The wafer dryer as recited in claim 11, wherein the solution drain line includes:

a first drain line; and a second drain line for draining the solution contained in the internal bath faster than the first drain line, wherein the pump is installed on the first drain line.

17. The wafer dryer as recited in claim 11, wherein the drying means includes:

an isopropyl alcohol (IPA) nozzle which is installed on the internal bath, the nozzle spraying IPA into the internal bath;

a first spray nozzle which is installed on the internal bath, the first spray nozzle adapted to inject a gas into the internal bath; and a second spray nozzle which is installed on all inner sidewalls of the external bath, the second spray nozzle having a plurality of holes for injecting the gas to the external bath.

18. The wafer dryer as recited in claim 11, further comprising a speed converting apparatus for adjusting a rotation speed of the pump to convert a speed of the drained solution.

19. The wafer dryer as recited in claim 11, wherein the solution is a de-ionized (DI) water.

* * * * *

UNITED STATES PATENT AND TRADEMARK OFFICE
CERTIFICATE OF CORRECTION

PATENT NO. : 6,748,672 B2
DATED : June 15, 2004
INVENTOR(S) : Lee et al.

It is certified that error appears in the above-identified patent and that said Letters Patent is hereby corrected as shown below:

Column 5,
Line 28, "installed an the second" should read -- installed on the second --.
Line 39, "bath; and has" should read -- bath and has --.
Line 48, "claim 1 further" should read -- claim 1, further --.

Column 6,
Line 20, "which the first" should read -- which is installed on the first --.
Line 24, "second in drain" should read -- second drain --.

Signed and Sealed this

Third Day of May, 2005

JON W. DUDAS
*Director of the United States Patent and Trademark Office*